United States Patent
Mok et al.

(10) Patent No.: US 7,279,412 B2
(45) Date of Patent: Oct. 9, 2007

(54) PARALLEL MULTI-LAYER PRINTED CIRCUIT BOARD HAVING IMPROVED INTERCONNECTION AND METHOD FOR MANUFACTURING THE SAME

(75) Inventors: Jee-Soo Mok, Chungcheongbuk-do (KR); Byung-Kook Sun, Seoul (KR); Chang-Kyu Song, Daejeon (KR); Geum-Hee Yun, Kyunggi-Do (KR); Tae-Hoon Kim, Daejeon (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 25 days.

(21) Appl. No.: 10/717,977

(22) Filed: Nov. 20, 2003

(65) Prior Publication Data

US 2005/0085065 A1  Apr. 21, 2005

(30) Foreign Application Priority Data

Oct. 20, 2003  (KR) ...................... 10-2003-0073097

(51) Int. Cl.
*H01L 21/4763* (2006.01)
*H05K 3/00* (2006.01)

(52) U.S. Cl. .................. 438/622; 438/624; 29/829

(58) Field of Classification Search ................ 438/629, 438/624, 622; 29/829, 831, 846, 847
See application file for complete search history.

(56) References Cited

U.S. PATENT DOCUMENTS

| | | | | |
|---|---|---|---|---|
| 5,258,094 A | * | 11/1993 | Furui et al. | 216/20 |
| 5,332,486 A | * | 7/1994 | DiFranco | 205/50 |
| 5,436,062 A | * | 7/1995 | Schmidt et al. | 428/209 |
| 6,297,459 B1 | * | 10/2001 | Wojnarowski et al. | 174/255 |
| 6,518,513 B1 | * | 2/2003 | Enomoto et al. | 174/262 |
| 6,613,986 B1 | * | 9/2003 | Hirose et al. | 174/255 |
| 6,826,830 B2 | * | 12/2004 | Egitto et al. | 29/852 |
| 2004/0194303 A1 | * | 10/2004 | Kim et al. | 29/852 |

FOREIGN PATENT DOCUMENTS

| | | |
|---|---|---|
| JP | 02-288299 | 11/1990 |
| JP | 07-147464 | 6/1995 |
| JP | 10-224039 | 8/1998 |
| JP | 11-112118 | 4/1999 |
| JP | 2002-016358 | 1/2002 |
| JP | 2003-224339 | 8/2003 |
| WO | WO 01/39267 A1 | 5/2001 |

\* cited by examiner

*Primary Examiner*—Michael Trinh
(74) *Attorney, Agent, or Firm*—Christensen O'Connor Johnson Kindness PLLC

(57) ABSTRACT

Disclosed are a multi-layer printed circuit board and a method for manufacturing the multi-layer printed circuit board. Circuit layers and insulating layers are alternately stacked so that via holes of the circuit layers provided with plated inner walls without application of additional plating and conductive paste-filling steps are connected to via holes of the insulating layers filled with a conductive paste.

11 Claims, 14 Drawing Sheets

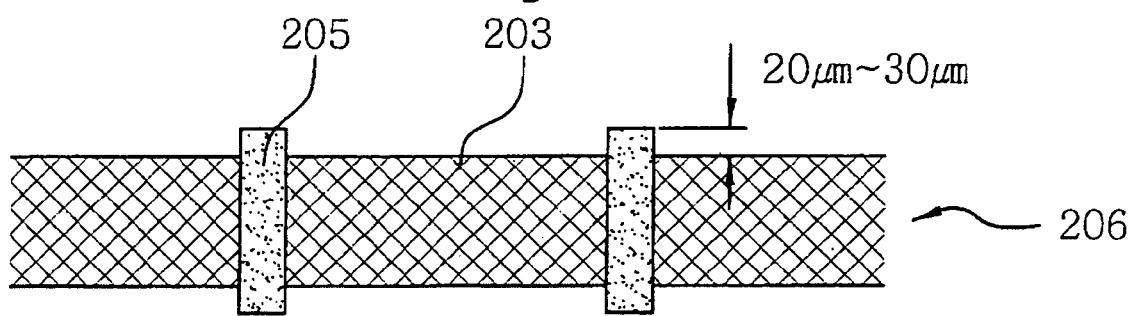

PARALLEL MULTI-LAYER PRINTED CIRCUIT BOARD HAVING IMPROVED INTERCONNECTION AND METHOD FOR MANUFACTURING THE SAME

BACKGROUND OF THE INVENTION

1. Field of the Invention

The present invention relates to a parallel multi-layer printed circuit board and a method for manufacturing the same. More particularly, the present invention relates to a multi-layer printed circuit board, in which circuit layers and insulating layers are alternately laid up by a parallel or batch stacking method, and are then pressed so that via holes of the circuit layers provided with plated inner walls without application of additional plating and conductive paste-filling steps are electrically connected to via holes of the insulating layers filled with a conductive paste, and a method for manufacturing the multi-layer printed circuit board.

2. Description of the Related Art

As well known to those skilled in the art, electronic products have been developed toward miniaturization, thin profile, high-density integration, assembly into a package and high portability. In order to meet the above trends, a multi-layer printed circuit board has been developed to have a fine pattern and be miniaturized and packaged. Accordingly, in order to increase the possibility of fine pattern formation, reliability and design density of the multi-layer printed circuit board, a raw material of the multi-layer printed circuit board has been changed, layer constitution of the multi-layer printed circuit board has become complicated, and components to be mounted on the multi-layer printed circuit board have been changed from DIP (Dual In-line Package) types to SMT (Surface Mount Technology) types so that an overall mount density of the components is increased. Further, since the electronic products have been developed toward high-functionality, Internet application, moving picture application and transmission/reception of high-capacity data, the printed circuit board has required an increasingly complicated design and a high level of technology.

Printed circuit boards (PCB) are divided into a single-sided PCB provided with wiring only on one surface of an insulating substrate, a double-sided PCB provided with wiring on both surfaces of an insulating substrate, and a multi-layered board (MLB) comprising multiple layers provided with wiring. Conventional electronic products had simple-structured components and a simple circuit pattern, thus mainly using the single-sided PCB. On the other hand, recent electronic products require a complicated-structured, high-density and fine circuit pattern, thus mainly using the double-sided PCB or the MLB. The present invention relates to a method for manufacturing the MLB.

The MLB comprises a plurality of layers, on which wiring is formed, in order to enlarge wiring areas. More specifically, the MLB comprises internal layers made of a thin core (T/C), and external layers. Basically, the MLB is a four-layer MLB (two internal layers and two external layers) obtained by attaching the internal and external layers to each other by Prepregs. That is, the MLB comprises at least four layers. The MLB may be a six-layer, eight-layer or ten-layer printed circuit board, or more plural-layer printed circuit board according to increase in the complexity of circuits on the MLB.

A power circuit, a ground circuit, a signal circuit, etc. are formed in the internal layer. The Prepreg is interposed between the internal layer and external layer, thus serving to attach the internal and external layers to each other and to insulate the internal and external layers from each other. Here, the wiring of each of the internal and external layers is connected to the wiring of the other layers by via holes (through holes).

The MLB is advantageous in that wiring density is remarkably increased, but disadvantageous in that its manufacturing process is complicated. Particularly, in a build-up method for manufacturing the MLB, in which additional layers are stacked on an internal layer provided with internal circuits formed thereon, it is impossible to deform the internal layer after the stacking of the layers. Accordingly, in this case, when the internal layer is defective, the MLB manufactured by stacking the additional layers on the internal layer fails. In order to detect such a failure, many test apparatuses are required.

FIGS. 1a to 1d are cross-sectional views illustrating a process for forming a circuit layer comprising a circuit pattern in a method for manufacturing a conventional multi-layer printed circuit board by a parallel or a batch stacking method. Via holes are formed through the circuit layer, and are then filled by plating so that the via holes of the circuit layer are electrically connected to via holes of an insulating layer or another circuit layer.

As shown in FIG. 1a, a copper stack plate 101 serving as a base substrate of a printed circuit board is prepared. Generally, the copper stack plate 101 includes a stiffening base material 103, and copper films 102 respectively coated on both surfaces of the stiffening base material 103.

As shown in FIG. 1b, via holes 104 are formed through the copper stack plate 101. The via holes 104 are formed so as to have a diameter of 50 μm to 100 μM using a laser such as an YAG (Yttrium-Aluminum-Garnet) laser or a $CO_2$ laser, or using a mechanical drilling method. The multi-layer printed circuit board conventionally comprises via holes having a diameter of 200 μm to 300 μm. However, by reducing the diameter of the via holes 104 as described above, the reduced via holes 104 can be filled by plating without application of plugging using any additional paste.

In FIG. 1c, upper and lower surfaces of the copper stack plate 101 and inner walls of the via holes 104 are plated by electro-plating and electroless-plating. Thereby, as shown in FIG. 1c, plating layers 105 are respectively formed on the upper and lower surfaces of the copper stack plate 101, the via holes 104 are filled by plating.

As described above, it is possible to achieve interconnection between layers by filling the via holes 104 by plating without application of any additional filling step. Further, the via holes 104 may be filled with a conductive paste after the inner walls of the via holes 104 are plated.

As shown in FIG. 1d, circuit patterns are formed on the copper stack plate 101 by a circuit pattern forming method such as an etching method. A circuit layer 106 obtained by the above-described process serves as circuit layers 106a, 106b and 106c of a multi-layer printed circuit board manufactured by a parallel or a batch stacking method, as shown in FIG. 3.

The above circuit layer 106 serves one of the circuit layers 106a, 106b and 106c of FIG. 3, and the via holes 104 and the circuit patterns of the circuit layer 106 are designed in consideration of the interconnection with an insulating layer.

The required number of the circuit and insulating layers is determined by the desired number of layers of the multi-layer printed circuit board to be manufactured. For example, a four-layer printed circuit board requires two circuit layers, a six-layer printed circuit board requires three circuit layers, and an eight-layer printed circuit board requires four circuit layers.

FIGS. 2a to 2d are cross-sectional views illustrating a process for forming an insulating layer interposed between circuit layers in a method for manufacturing a parallel multi-layer printed circuit board in accordance with the present invention.

As shown in FIG. 2a, a flat-type insulating material 201 is prepared. The flat-type insulating material 201 includes a Prepreg 203 and release films 202, made of polyester, respectively attached to both surfaces of the Prepreg 203.

The Prepreg 203 has a thickness, which is variously selected by specification of a product to be manufactured. The release film 202 has a thickness of 20 μm to 30 μm, and is provided in advance on the surfaces of the Prepreg 20 in a production process, or attached to the surfaces of the produced Prepreg 20.

As shown in FIG. 2b, via holes 204 are formed through the flat-type insulating material 201 by drilling. Here, the via holes 204 are obtained by mechanically drilling the flat-type insulating material 201. The via holes 204 have a diameter slightly larger than that of the via holes 104 formed through the circuit layer 106 in consideration of the interconnection between the insulating layer and the circuit layer.

The via holes 204 of the insulating layer, which is connected to the circuit layer manufactured by filling the via holes 104 by plating with reference to FIGS. 1a to 1d, have a diameter of approximately 100 μm.

As shown in FIG. 2c, the via holes 204 are filled with a conductive paste 205, and then as shown in FIG. 2d, the release films 202 are detached from both surfaces of the Prepreg 203.

An insulating layer 206 obtained by the above-described process serves as one of insulating layers 206a and 206b of FIG. 3.

Positions and sizes of the via holes 204 of the insulating layer 206 are designed in consideration of those of the via holes 104 of the circuit layer 106 connected to the insulating layer 206. Further, the number of the insulating layers 206 is determined by the desired number of layers of the multi-layer printed circuit board to be manufactured. For example, a four-layer printed circuit board requires one insulating layer, a six-layer printed circuit board requires two circuit layers, and an eight-layer printed circuit board requires three circuit layers. On the other hand, in case of using a build-up manufacturing method, a four-layer printed circuit board requires two insulating layers, and a six-layer printed circuit board requires four circuit layers.

As shown in FIG. 3, the circuit layers 106a, 106b and 106c manufactured by the process shown in FIGS. 1a to 1d and the insulating layers 206a and 206b manufactured by the process shown in FIGS. 2a to 2d are alternately stacked.

The via holes of the stacked layers 106a, 106b, 106c, 206a and 206b precisely coincide with each other by a targeting method or a pin-matching method.

In the targeting method, a target hole is formed at a position of "a target guide mark", serving as a reference point of drilling, by means of a target drill using X-rays, after the stacking of the circuit layers 106a, 106b and 106c and the insulating layers 206a and 206b.

In the pin-matching method, a hole serving as a reference point of interlayer matching, i.e., a guide hole, is formed at the predetermined same positions of the circuit layers 106a, 106b and 106c and the insulating layers 206a and 206b, and then when the circuit layers 106a, 106b and 106c and the insulating layers 206a and 206b are laid up, a pin is inserted into the guide holes formed through the circuit layers 106a, 106b and 106c and the insulating layers 206a and 206b so that the via holes 104 of the circuit layers 106a, 106b and 106c and the via holes 204 of the insulating layers 206a and 206b are matched.

Thereafter, as shown in FIG. 3, the laid-up circuit layers 106a, 106b and 106c and insulating layers 206a and 206b are pressed in a direction of arrows by a press, thereby being produced into a six-layer printed circuit board shown in FIG. 4.

Thereafter, post-treatment such as a trimming step for trimming resin and copper film located at the edge of the printed circuit board is performed, thereby preventing a product mounted on the printed circuit board from being damaged and users from being damaged from the sharp edge of the printed circuit board.

A multi-layer printed circuit board manufactured by a build-up method has a structure such that an insulating layer is stacked on one double-sided printed circuit board and then a single-sided printed circuit board is stacked thereon. However, a multi-layer printed circuit board manufactured by a parallel or a batch stacking method has a structure such that a plurality of double-sided printed circuit boards and a plurality of insulating layers are alternately stacked.

Based on the above-described difference between the above-described methods, it is possible to judge a manufacturing method of a printed circuit board by checking a cross-section of the printed circuit board.

PCT publication No. WO2001/39267 discloses a method for manufacturing a multi-layer printed circuit board by alternately stacking a plurality of single-sided printed circuit boards and adhesive layers on a base layer obtained by forming a circuit on one surface or both sides of an insulating material, and by pressing the stacked layers.

A cross-section of the multi-layer printed circuit board manufactured by the method disclosed by the above patent is the same as a cross-section of a multi-layer printed circuit board manufactured by a build-up method. Here, the insulating material in a c-stage rather than a Prepreg in a b-stage is used.

Accordingly, there has been proposed a method for manufacturing a multi-layer printed circuit board by a batch stacking method, which is simpler than the method disclosed by the above patent.

SUMMARY OF THE INVENTION

Therefore, the present invention has been made in view of the above problems, and it is an object of the present invention to provide a multi-layer printed circuit board, in which plating and paste-plugging steps for filling via holes of circuit layers are omitted, and a method for manufacturing the multi-layer printed circuit board, thus reducing a production cost and shortening a process time.

It is another object of the present invention to provide a multi-layer printed circuit board, in which contact areas between via holes of circuit layers and via holes of insulating layers are increased, and a method for manufacturing the multi-layer printed circuit board, thus improving electric conductivity and reliability in interconnection between the circuit layers and the insulating layers.

In accordance with one aspect of the present invention, the above and other objects can be accomplished by the provision of a method for manufacturing a parallel multi-layer printed circuit board, comprising the steps of:

(A) forming a predetermined number of circuit layers, including the sub-steps of: (a) forming via holes through a copper stack plate; (b) plating surfaces of the copper stack plate and inner walls of the via holes with copper; and (c) forming circuit patterns on the copper stack plate;

(B) forming a predetermined number of insulating layers, including the sub-steps of: (a) forming via holes through a flat-type insulating material provided with release films attached to surfaces of the flat-type insulating material; (b) filling the via holes with a conductive paste; and (c) removing the release films from the flat-type insulating material;

(C) alternately arranging the circuit layers and the insulating layers at predetermined positions;

(D) pressing the arranged circuit and insulating layers; and (E) forming circuit patterns on the outermost layers of a board obtained by pressing the circuit layers and the insulating layers.

Preferably, in the sub-step (c) of the step (A), a circuit pattern may be formed on one surface of the copper stack plate so as to form the circuit layer arranged on an outermost layer of the printed circuit board, and circuit patterns may be formed on both surfaces of the copper stack plate so as to form the circuit layer arranged on an internal layer of the printed circuit board.

Preferably, the step (A) may further include the sub-step of: (d) surface-treating the copper stack plate.

Moreover, preferably, the method may further comprise the step of: (F) forming a target hole at the position of a target guide mark, serving as a reference point of drilling, on the circuit layers and the insulating layers.

Preferably, the sub-step (a) of each of the steps (A) and (B) includes the step of: (a') forming a guide hole at the same position serving as a reference point of interlayer matching, on the circuit layers and the insulating layers.

Moreover, preferably, the method may further comprise the step of: (C') buffing a portion of the conductive paste, flowing out from the via holes of the outmost layer, so as to remove the protruding portion of the conductive paste, after the step (C).

Preferably, the release film may have a thickness of 20 μm to 50 μm.

Further, preferably, the conductive paste may be a metallic bond-type conductive paste impregnated with a tin (Sn) component.

Moreover, preferably, the conductive paste may be a point contact-type conductive paste.

Preferably, the flat-type insulating material may include a resin material in a c-stage, and resin layers in a b-stage respectively stacked on both surfaces of the resin material.

In accordance with another aspect of the present invention, there is provided a multi-layer printed circuit board comprising: a plurality of circuit layers, each of the circuit layers provided with a plurality of via holes filled with a conductive paste; and a plurality of insulating layers, each of the insulating layers provided with a plurality of via holes filled with a conductive paste, wherein the filling of the via holes of the circuit layers and the via holes of the insulating layers is performed by a single process.

Preferably, the conductive paste may be a metallic bond-type conductive paste impregnated with a tin (Sn) component.

Further, preferably, the conductive paste may be a point contact-type conductive paste.

BRIEF DESCRIPTION OF THE DRAWINGS

The above and other objects, features and other advantages of the present invention will be more clearly understood from the following detailed description taken in conjunction with the accompanying drawings, in which:

FIGS. 2a to 2d are cross-sectional views illustrating a process for forming an insulating layer interposed between circuit layers in the conventional method for manufacturing a parallel multi-layer printed circuit board;

DESCRIPTION OF THE PREFERRED EMBODIMENTS

Now, preferred embodiments of the present invention will be described in detail with reference to the annexed drawings.

First, a process for manufacturing a circuit layer and a process for manufacturing an insulating layer in a method for manufacturing a parallel multi-layer printed circuit board in accordance with the present invention will be described.

FIGS. 5a to 5f are cross-sectional views illustrating the process for forming a circuit layer in the method for manufacturing a parallel multi-layer printed circuit board in accordance with one embodiment of the present invention.

Figure 1A:
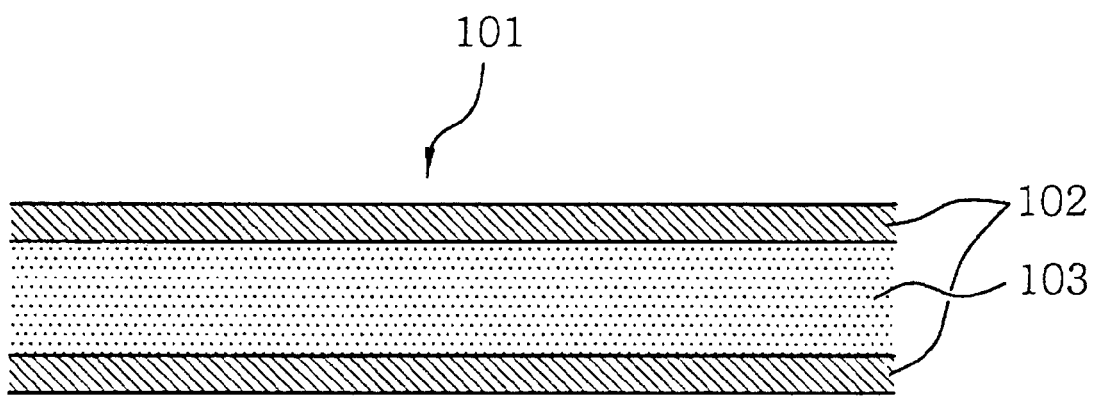
FIGS. 1a to 1d are cross-sectional views illustrating a process for forming a circuit layer in a conventional method for manufacturing a parallel multi-layer printed circuit board.
Figure 1B:
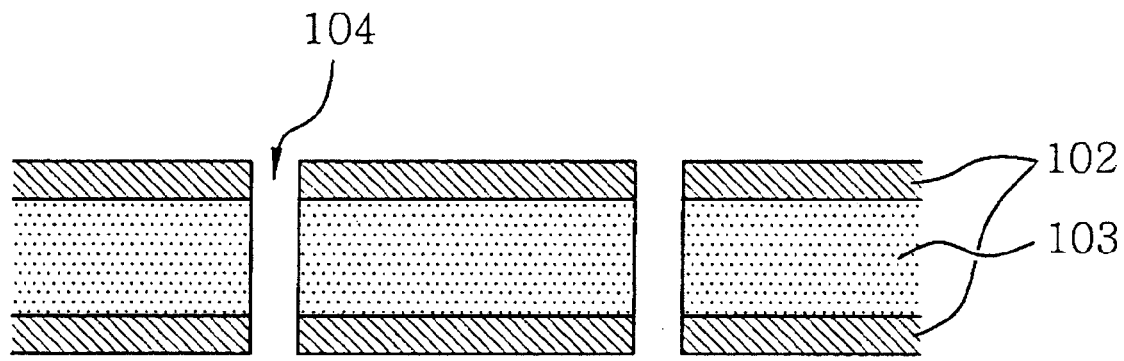
Figure 1C:
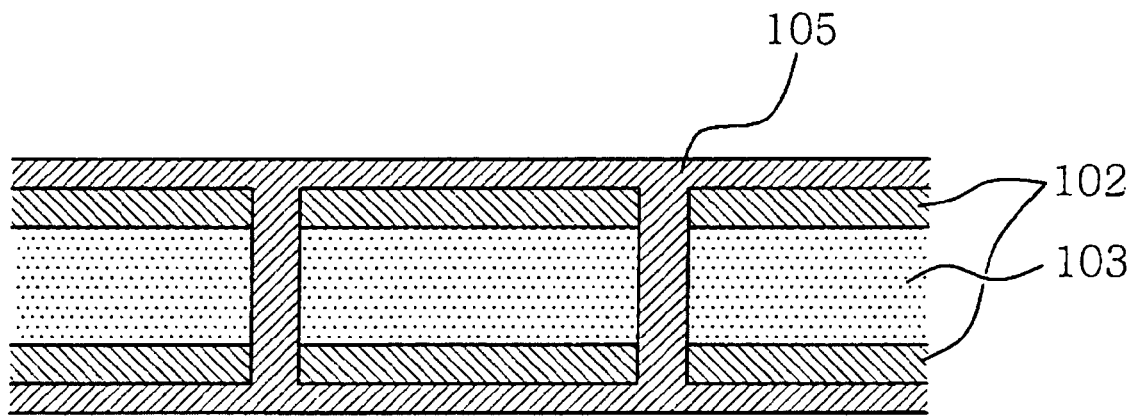
Figure 1D:
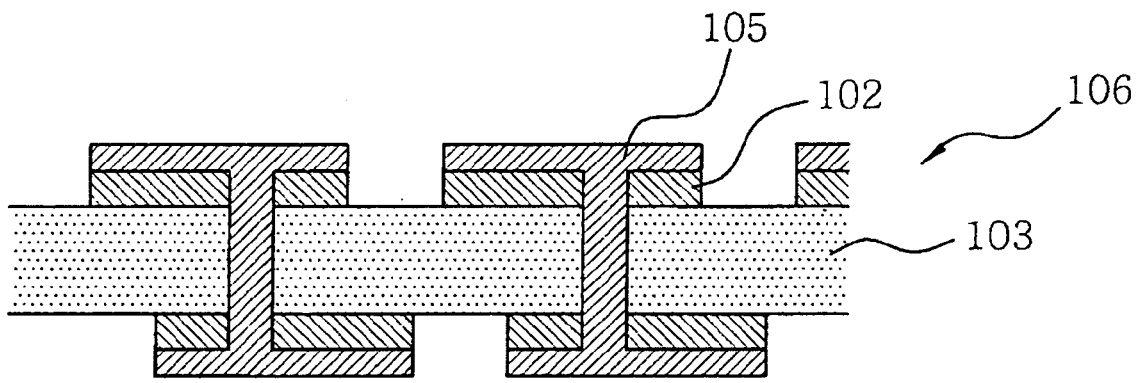
Figure 2A:
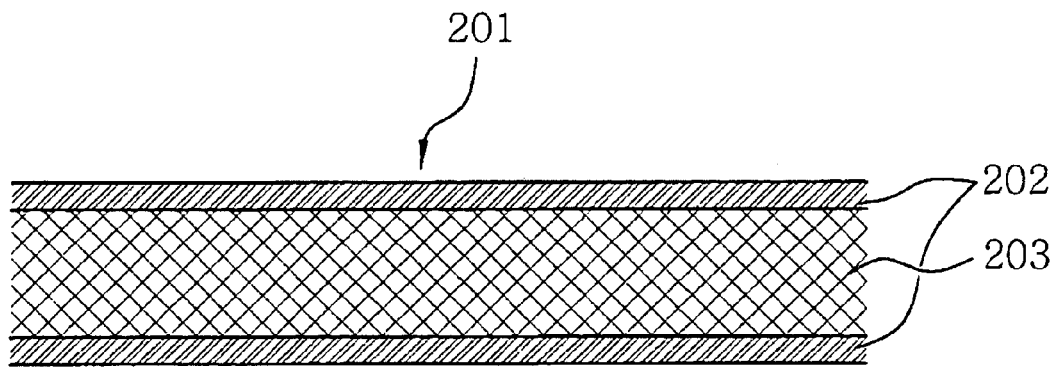
Figure 2B:
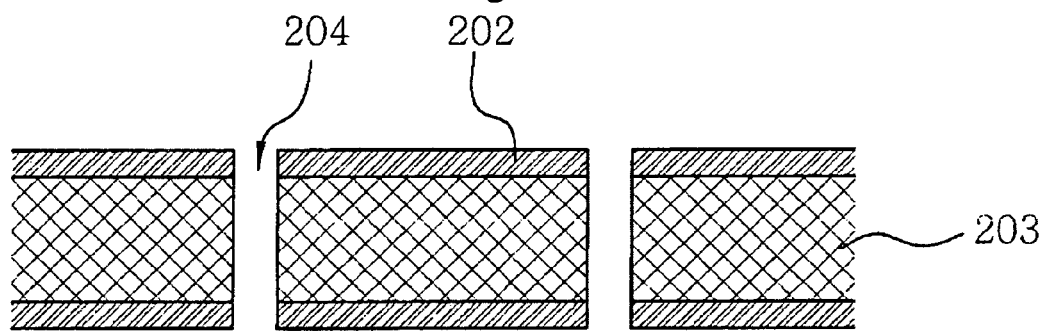
Figure 2C:
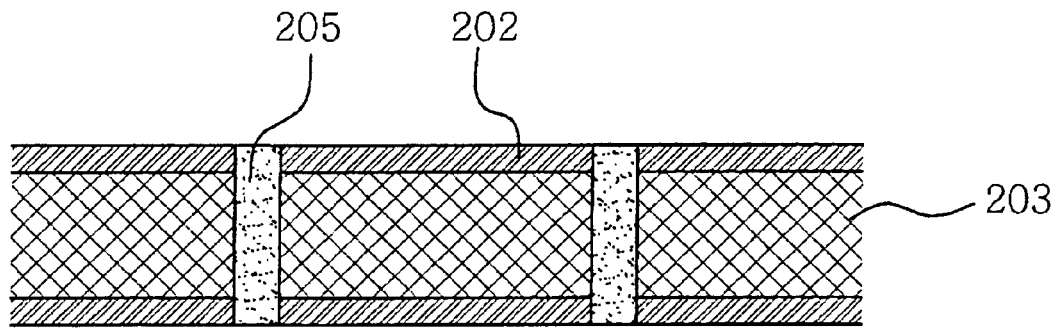
Figure 3:
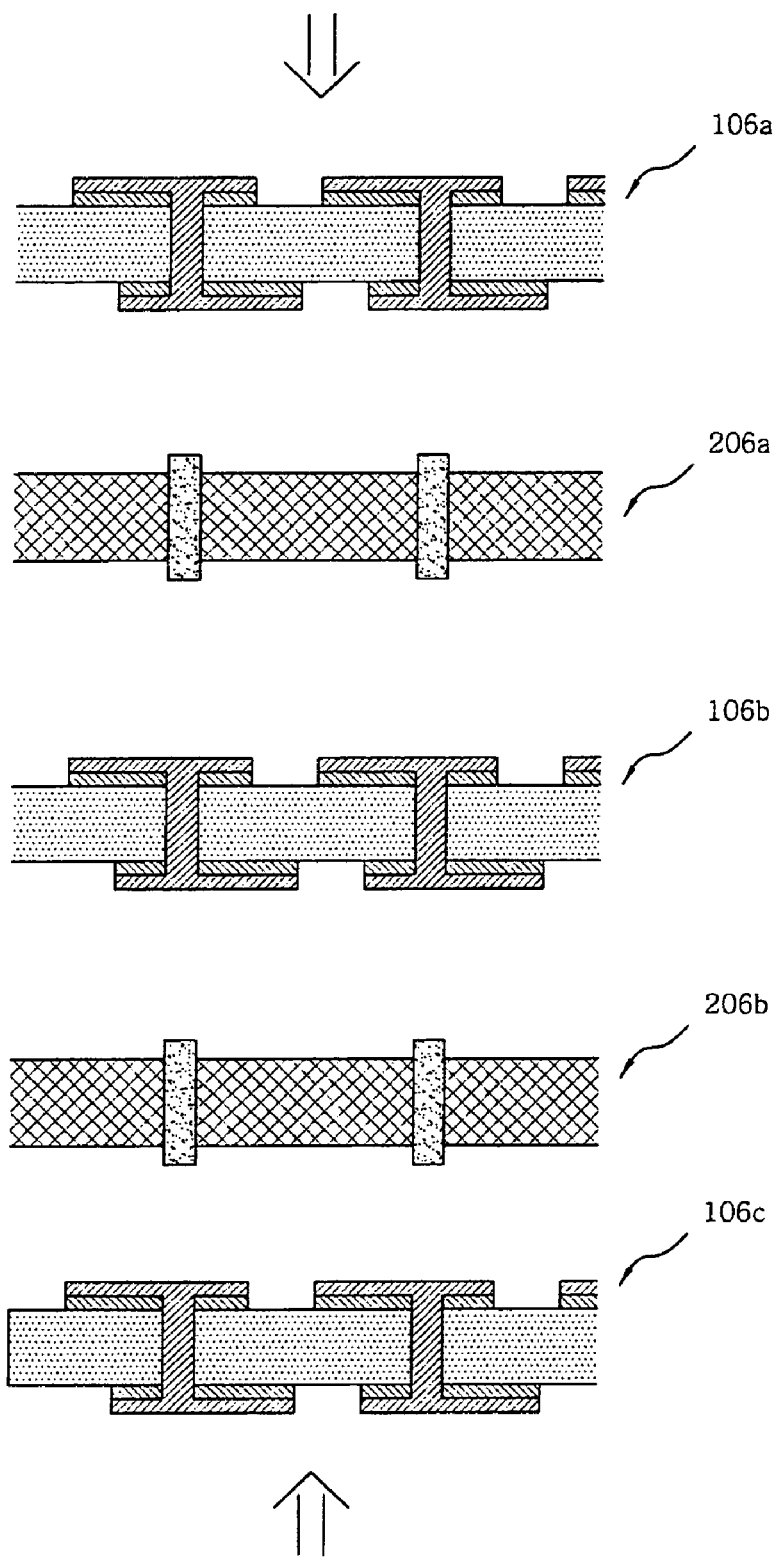
FIG. 3 is an exploded cross-sectional view of a conventional parallel eight-layer printed circuit board, in which circuit layers and insulating layers are alternately stacked.
Figure 4:
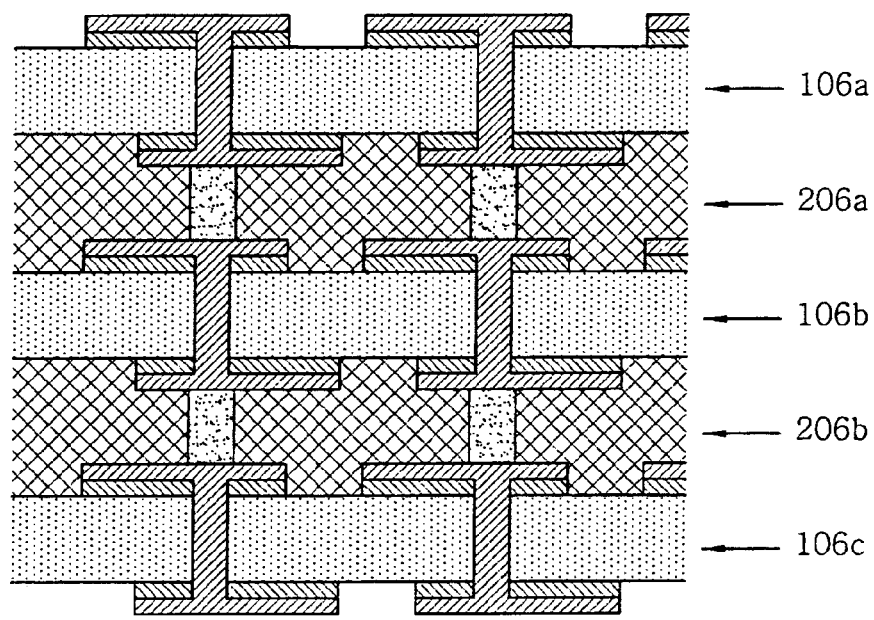
FIG. 4 is an assembled cross-sectional view of the conventional parallel eight-layer printed circuit board, in which circuit layers and insulating layers are alternately stacked.
Figure 5A:
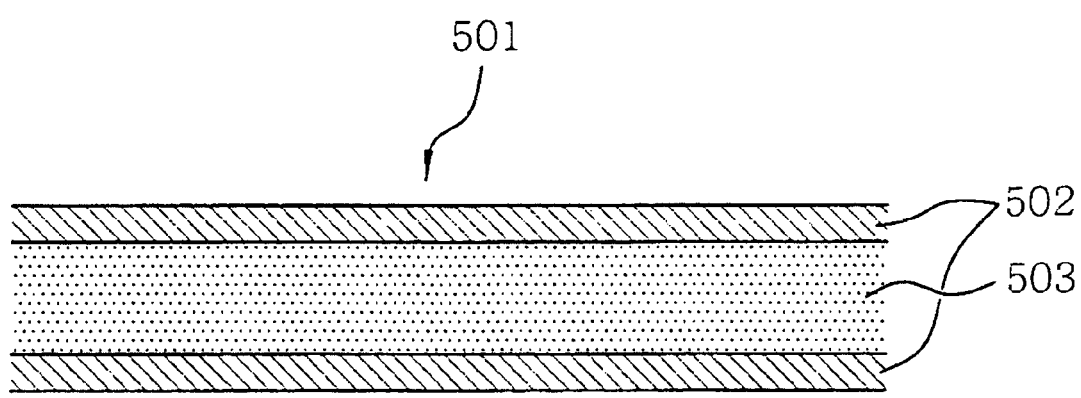
FIGS. 5a to 5f are cross-sectional views illustrating a process for forming a circuit layer in a method for manufacturing a parallel multi-layer printed circuit board in accordance with one embodiment of the present invention.

As shown in FIG. 5a, a copper stack plate 501 serving as a base substrate of a circuit layer is prepared. The copper stack plate 501 includes a stiffening base material 503, and copper films 502 respectively coated on both surfaces of the stiffening base material 503.

The copper stack plate 501 is divided into several types according to kinds of the stiffening base material 503. That is, there are an glass/epoxy substrate (FR-4) obtained by coating a stiffening base material, produced by impregnating a glass fiber with epoxy, with a copper film, a thermally stable resin/copper stack plate obtained by coating a stiffening base material, produced by impregnating a glass fiber with polyimide and BT resin, with a copper film, and a flexible copper stack plate obtained by coating a polyimide film with a copper film. The glass/epoxy substrate (FR-4) is commonly used. Although the glass/epoxy substrate (FR-4) is used as the copper stack plate 501 in FIG. 1, other materials may be selectively used as the copper stack plate 501 according to purposes of the manufactured printed circuit board.

Figure 5B:
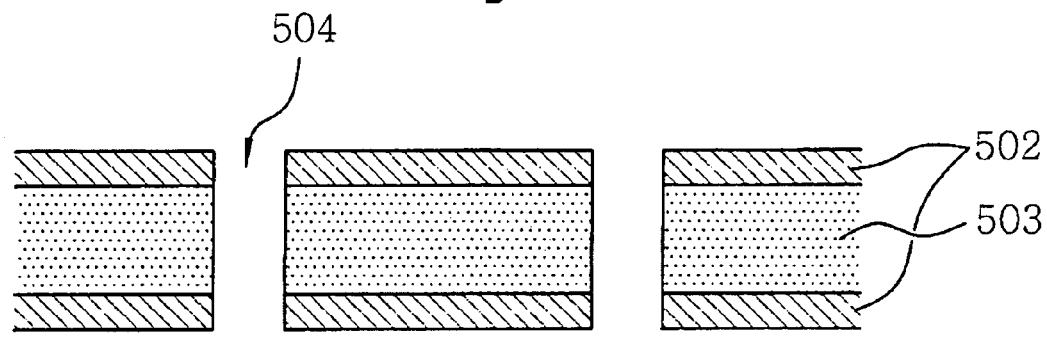

As shown in FIG. 5*b*, via holes 504 are formed through the copper stack plate 501 by drilling. Here, the via holes 504 has a diameter of approximately 0.1 mm.

Figure 5C:
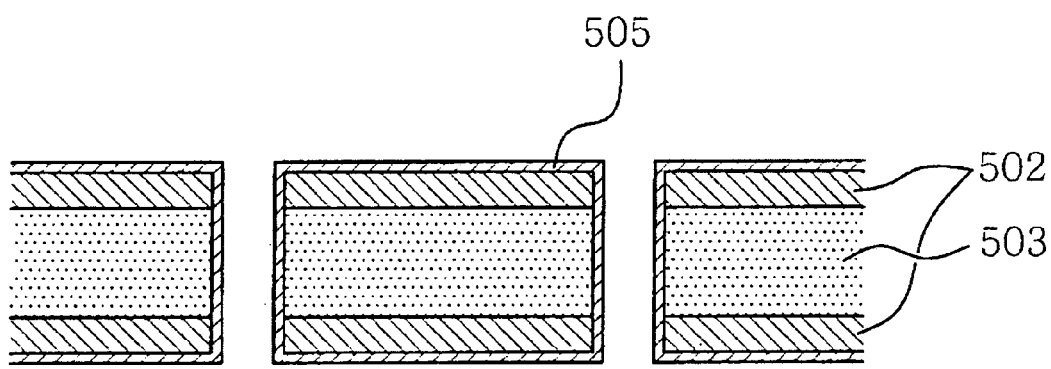

Thereafter, as shown in FIG. 5*c*, a copper-plating layer 505 is formed on upper and lower surfaces of the copper stack plate 501 and inner walls of the via holes 504 by electroless-plating and electro-plating.

Figure 5D:
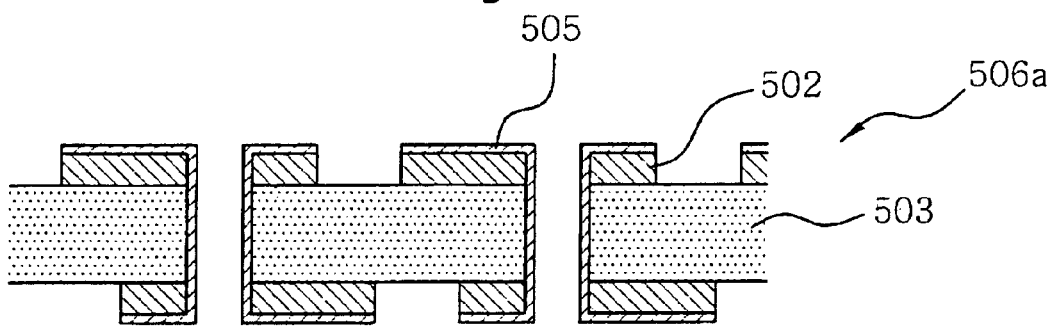

FIG. 5*d* illustrates circuit patterns respectively formed on both surfaces of the copper stack plate 501. Here, the circuit patterns are obtained by an etching resist depositing step, an etching resist pattern forming step and an etching step.

Figure 8:
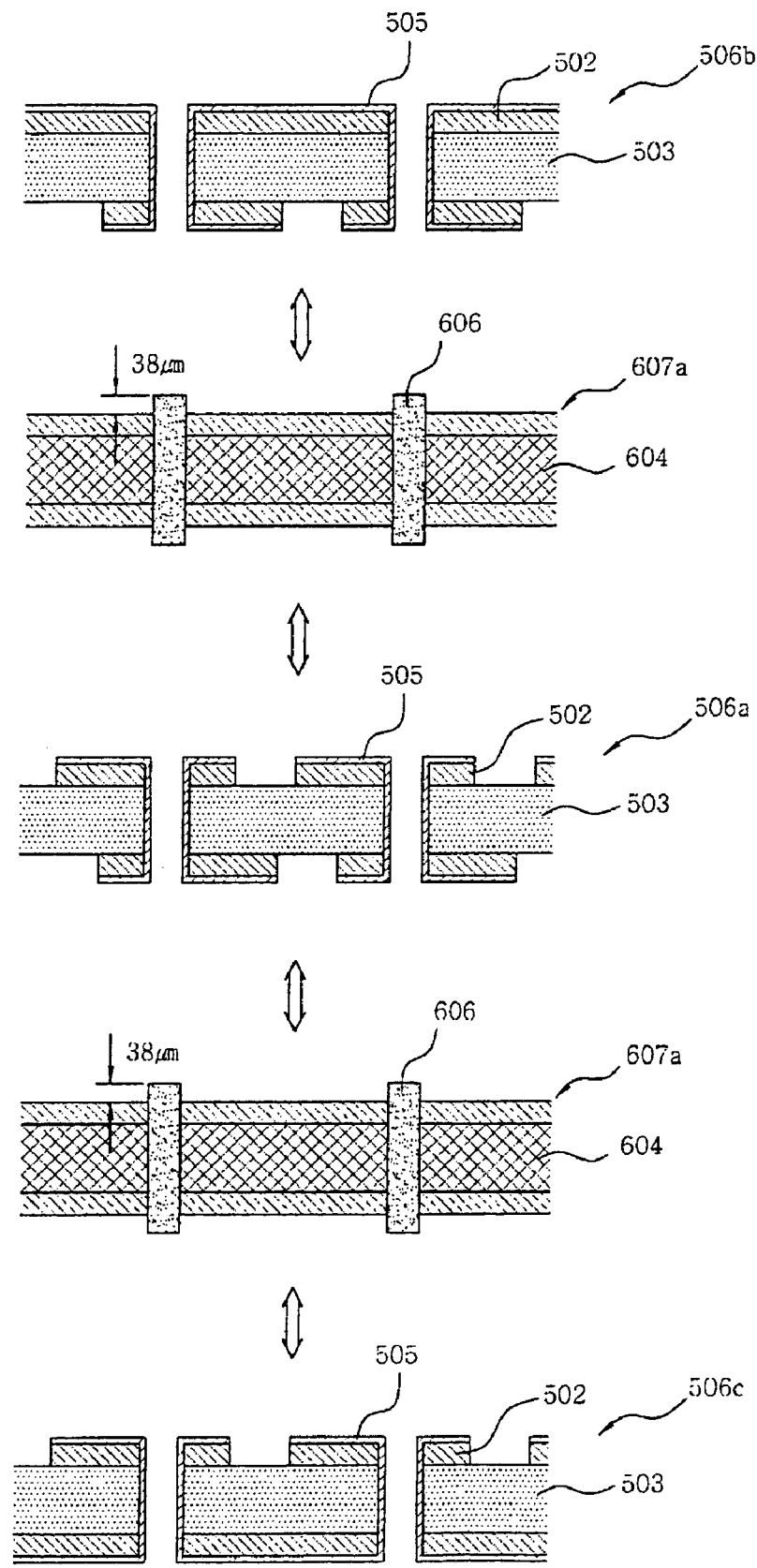
FIG. 8 is an exploded cross-sectional view of a parallel multi-layer printed circuit board manufactured by the method of the present invention, in which circuit layers and insulating layers are alternately stacked.

A circuit layer 506*a* provided with the circuit patterns formed on both surfaces of the copper stack plate 501, obtained by the above-described process, serves as an internal circuit layer of a multi-layer printed circuit board in FIG. 8.

Those skilled in the art will appreciate that the circuit patterns may be formed by various methods other than the above-described etching method.

Figure 5E:
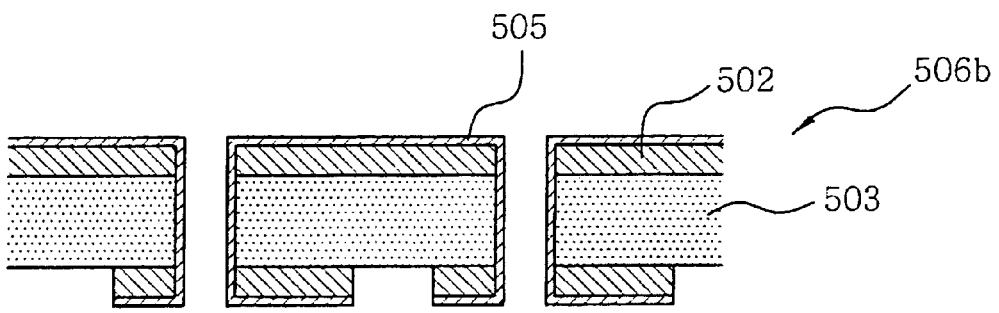

FIG. 5*e* illustrates a circuit pattern formed only on the lower surface of the copper stack plate 501 provided with the copper-plating layer 505. A circuit layer 506*b* provided with the circuit pattern formed only on the lower surface of the copper stack plate 501, obtained by this process, serves as the uppermost circuit layer of the multi-layer printed circuit board in FIG. 8.

Figure 5F:
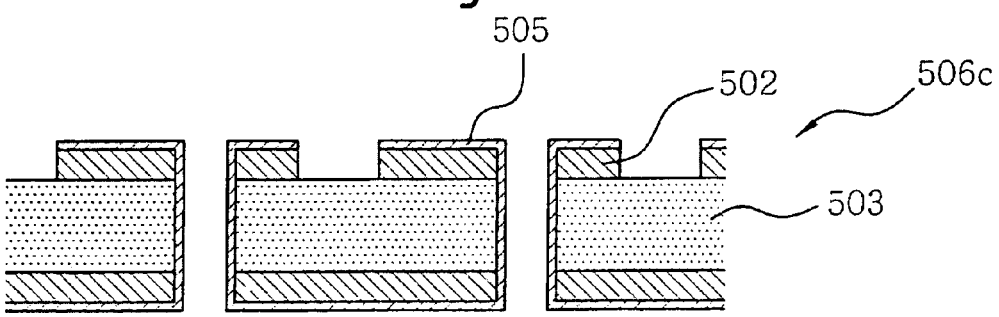

FIG. 5*f* illustrates a circuit pattern formed only on the upper surface of the copper stack plate 501 provided with the copper-plating layer 505. A circuit layer 506*c* provided with circuit pattern 506*c* formed only on the upper surface of the copper stack plate 501, obtained by this process, serves as the lowermost circuit layer of the multi-layer printed circuit board in FIG. 8.

Each of the circuit layers 506*a*, 506*b* and 506*c* manufactured by the above-described processes serves as one of three types of circuit layers, i.e., the internal circuit layer, the uppermost circuit layer, and the lowermost circuit layer, of the multi-layer printed circuit board in FIG. 8. Precise positions and dimensions of the via holes and the circuit patterns of the circuit layers are designed in consideration of the interconnection with insulating layers.

Further, the number of the required circuit layers is determined by the desired number of layers of the multi-layer printed circuit board. For example, a four-layer printed circuit board requires two circuit layers, a six-layer printed circuit board requires three circuit layers, and an eight-layer printed circuit board requires four circuit layers.

Hereinafter, a process for an insulating layer, which is interposed between the circuit layers 506*a*, 506*b* and 506*c*, in a method for manufacturing a parallel multi-layer printed circuit board in accordance with the present invention will be described.

FIGS. 6*a* to 6*d* are cross-sectional views illustrating the process for forming an insulating layer in a method for manufacturing a parallel multi-layer printed circuit board in accordance with one embodiment of the present invention.

Figure 6A:
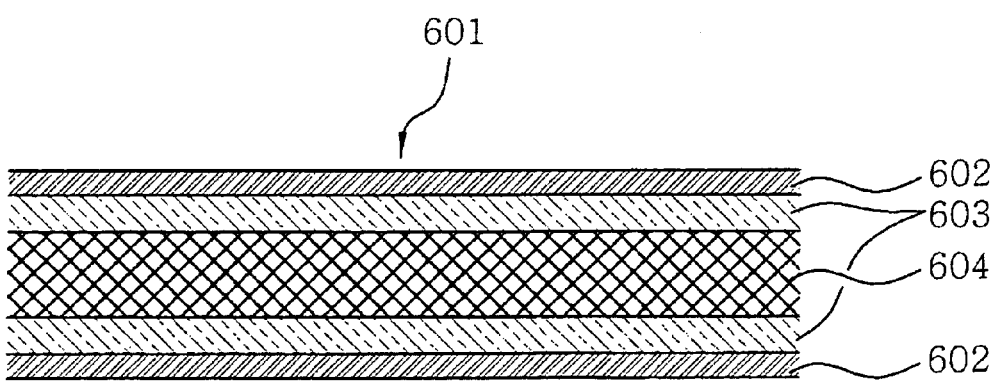
FIGS. 6a to 6d are cross-sectional views illustrating a process for forming an insulating layer in a method for manufacturing a parallel multi-layer printed circuit board in accordance with one embodiment of the present invention.

As shown in FIG. 6*a*, a flat-type insulating material 601 serving as a base substrate of an insulating layer is prepared. The insulating layer has a three-layer structure including a thermosetting resin 604 in a c-stage, thermosetting resins 603 in a b-stage respectively stacked on both surfaces of the thermosetting resin 604, and a release film 602, made of polyester, attached on the thermosetting resins 603.

An insulating layer made of a dielectric substance, i.e., resin, has an impedance higher than that of a circuit layer in a multi-layer printed circuit board. The impedance influences operation of circuits. The value of the impedance of the insulating layer is affected by thickness tolerance of the insulating layer, and characteristics of the resin, such as dielectric constant, weight and volume. As described above, the insulating layer provided with the insulating material 601 including the thermosetting resins 603 coated on the thermosetting resin 604 can easily control impedance, and assure good plasticity in the interconnection with the circuit layer in the method for manufacturing the multi-layer printed circuit board in accordance with the present invention.

Each of the thermosetting resins 603 and 604 has a thickness, which is variously selected by specification of a product to be manufactured. A conventional release film has a thickness of 20 μm or less. The release film 602 of the insulating layer of the multi-layer printed circuit board of the present invention has a thickness of approximately 20 μm to 50 μm.

The release film 602 is provided in advance on the surfaces of the thermosetting resins 603 in a production process of the thermosetting resins 603 and 604, or attached to the surfaces of the thermosetting resins 603 stacked on the thermosetting resin 604.

Figure 6B:
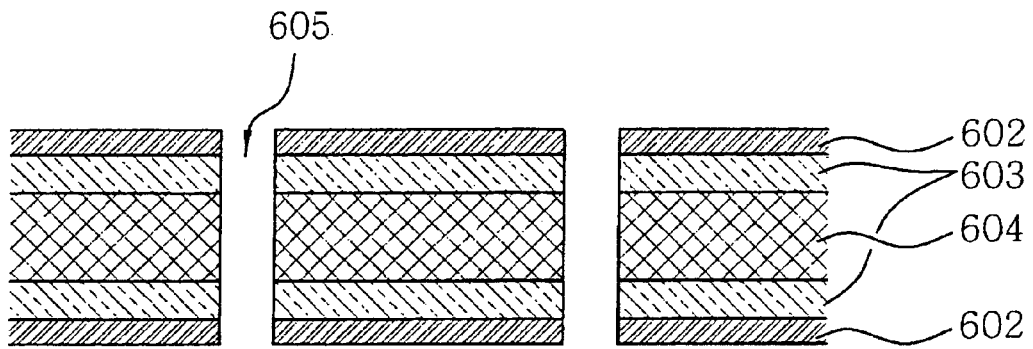

As shown in FIG. 6*b*, via holes 605 are formed through the flat-type insulating material 601 by drilling.

Figure 6C:
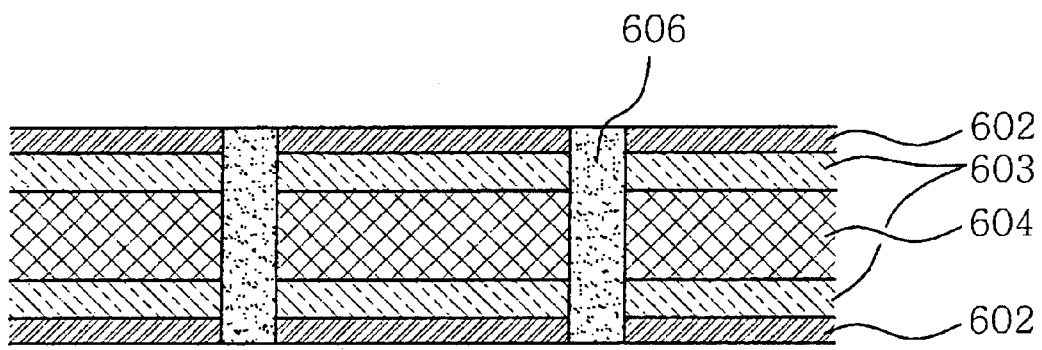

In FIG. 6*c*, the via holes 605 are filled with a conductive paste 606, and are then thermally cured. Here, the conductive paste 606 is divided into two types, i.e., a point contact-type paste made of a conductive material, and a metallic bond-type paste made of a resin having an adhesive property and a metallic component permeated into the resin.

For example, the metallic bond-type paste is made of a resin having an adhesive property, and a tin (Sn) component permeated into the resin. When such a metallic bond-type paste is heated, the tin component is metallic-bonded with the copper films of the inner walls of the via holes or the circuit patterns, thus being electrically connected to the copper films forming the circuit patterns.

Preferably, the metallic bond-type paste is used as the conductive paste filling the via holes 605 of the insulating layer 601 of the multi-layer printed circuit board of the present invention.

Figure 6D:
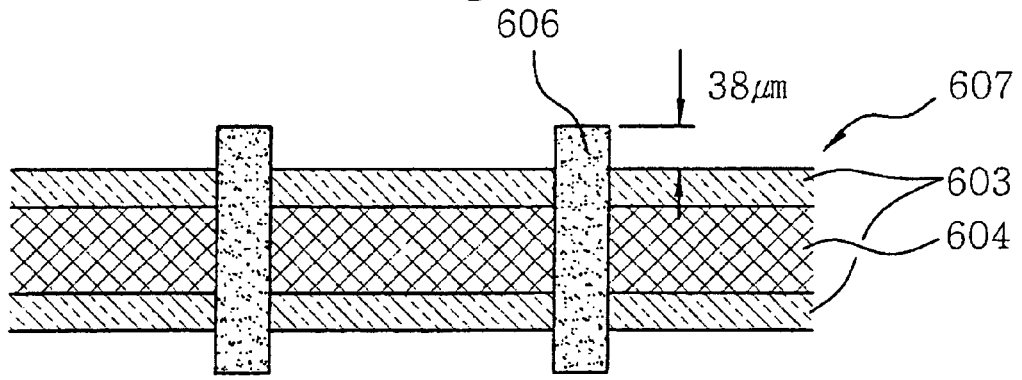

Thereafter, as shown in FIG. 6*d*, the release film 602 is detached from the surface of the thermosetting resin 603. When the release film 602 is detached from the surface of the thermosetting resin 603, the conductive paste 606 is protruded from the surface of the thermosetting resin 603. Here, the height of a protruding portion of the conductive paste 606 is determined by the thickness of the release film 602.

In the present invention, the release film 602 has a thickness of 20 μm to 50 μm, and preferably has a thickness of approximately 38 μm. Accordingly, the protruding portion of the conductive paste 606 has a height of 20 μm to 50 μm, and preferably has a height of approximately 38 μm.

An insulating layer 607 manufactured by the above-described process serves as one of insulating layers 607*a* and 607*b* interposed between the circuit layers 506*a*, 506*b* and 506*c* of the multi-layer printed circuit board in FIG. 8.

FIGS. 7*a* to 7*d* are cross-sectional views illustrating a process for forming an insulating layer in a method for manufacturing a parallel multi-layer printed circuit board in accordance with another embodiment of the present invention.

Figure 7A:
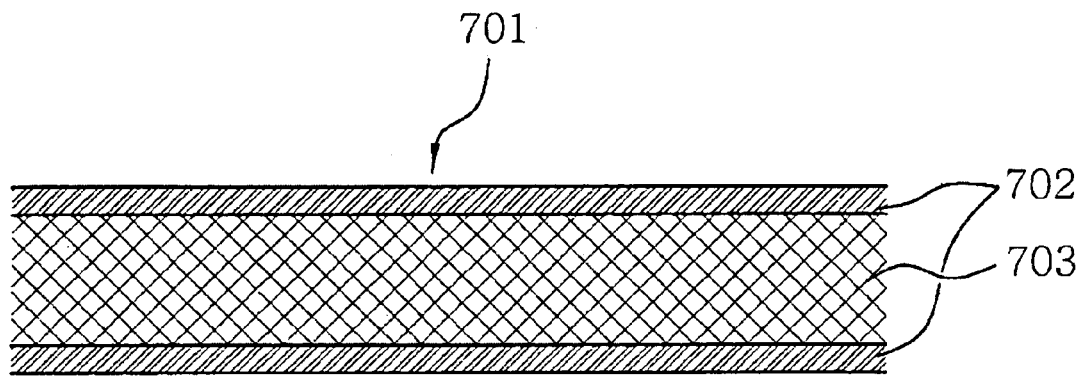
FIGS. 7a to 7d are cross-sectional views illustrating a process for forming an insulating layer in a method for manufacturing a parallel multi-layer printed circuit board in accordance with another embodiment of the present invention.

As shown in FIG. 7a, a flat-type insulating material 701 is prepared. The flat-type insulating material 701 includes an insulating layer in a b-stage or a Prepreg 703, and release films 702 respectively attached to both surfaces of the insulating layer or the Prepreg 703. The Prepreg 703 has a thickness, which is variously selected according to specification of a product to be manufactured. As described above, the film 702 has a thickness of approximately 20 μm to 50 μm, and preferably has a thickness of approximately 38 μm. The films 702 are provided in advance on the surfaces of the insulating layer or the Prepreg 703 in a production process of the insulating layer or the Prepreg 703, or, if necessary, attached to the surfaces of the produced insulating layer or the Prepreg 703.

Figure 7B:
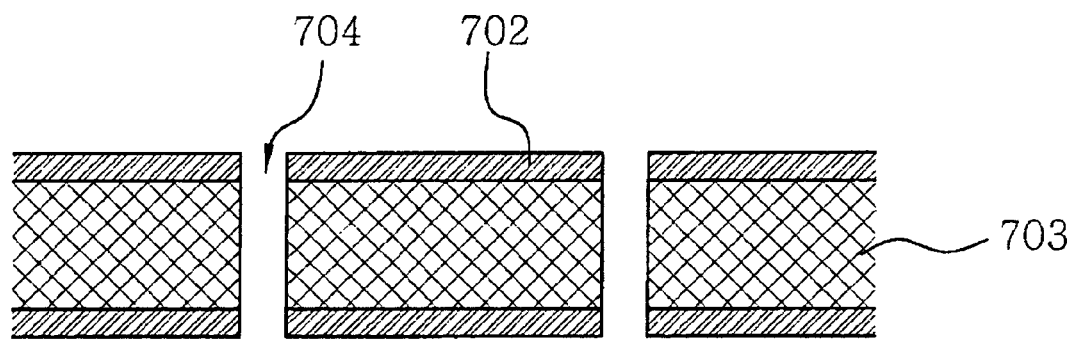

As shown in FIG. 7b, via holes 704 are formed through the flat-type insulating material 701 by drilling. Preferably, the via holes 704 are obtained by mechanically drilling the flat-type insulating material 701. The via holes 704 have a diameter nearly the same as that of the via holes 504 formed through each of the circuit layers 506a, 506b and 506c in consideration of the interconnection between the insulating layer and the circuit layer. Preferably, the via holes 704 have a diameter of approximately 0.15 mm.

Figure 7C:
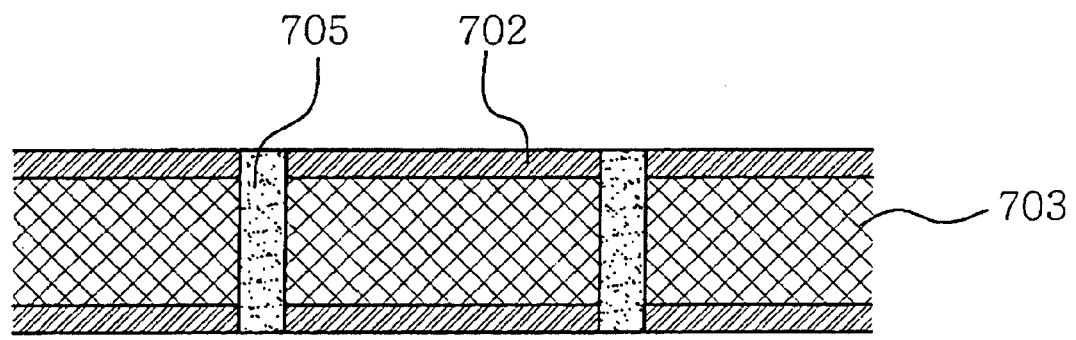

As shown in FIG. 7c, the via holes 704 are filled with a conductive paste 705. Here, a metallic bond-type paste having conductivity is used as the conductive paste 705 filling the via holes 704.

The above metallic bond-type paste is made of a resin having an adhesive property, and a tin (Sn) component permeated into the resin. When such a metallic bond-type paste is heated, the tin component is metallic-bonded with the inner walls of the via holes or the circuit patterns, thus being electrically connected to the via holes or the circuit patterns.

Accordingly, preferably, the metallic bond-type paste is used as the conductive paste 705 filling the via holes 704 of the insulating layer.

Figure 7D:
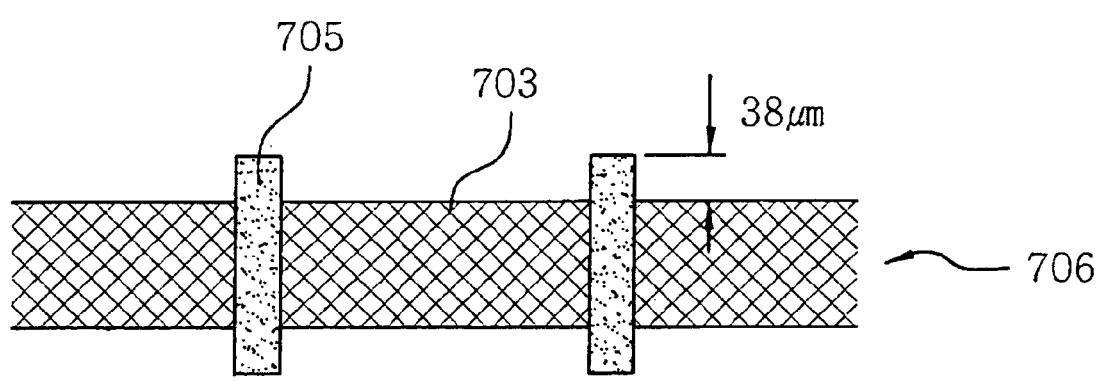

Thereafter, as shown in FIG. 7d, the release films 702 are detached from the surfaces of the Prepreg 703. When the release films 702 are detached from the surfaces of the Prepreg 703, the conductive paste 705 is protruded from the surfaces of the Prepreg 703. Here, the height of a protruding portion of the conductive paste 705 is determined by the thickness of the release film 702. In the present invention, in case that the release film 702 has a thickness of approximately 38 μm, the protruding portion of the conductive paste 705 has a height of approximately 38 μm.

An insulating layer 707 manufactured by the above-described process serves as one of insulating layers 607a and 607b interposed between the circuit layers 506a, 506b and 506c of the multi-layer printed circuit board in FIG. 8.

As shown in FIG. 8, the circuit layers 506a, 506b and 506c, which are manufactured by the process shown in FIGS. 5a to 5f, and the insulating layers 607 or 707, which are manufactured by the process shown in FIGS. 6a to 6d or FIGS. 7a to 7d are alternately stacked. Here, the circuit layer 506a provided with circuit patterns respectively formed on both surfaces thereof is arranged at an internal area of the multi-layer printed circuit board, the circuit layer 506b provided with a circuit pattern formed only on the lower surface thereof is arranged at the uppermost area of the multi-layer printed circuit board, and the circuit layer 506c provided with a circuit pattern formed only on the upper surface thereof is arranged at the lowermost area of the multi-layer printed circuit board.

The circuit layers 506a, 506b and 506c, and the insulating layers 607a and 607b, or 707a and 707b are stacked so that the via holes of the circuit layers 506a, 506b and 506c, and the via holes of the insulating layers 607a and 607b, or 707a and 707b precisely coincide with each other by a targeting method or a pin-matching method.

In the targeting method, a target hole is formed at a position of "a target guide mark", serving as a reference point of drilling, by means of a target drill using X-rays, after the stacking of the circuit layers 506a, 506b and 506c and the insulating layers 607a and 607b, or 707a and 707b.

In the pin-matching method, a hole serving as a reference point of interlayer matching, i.e., a guide hole, is formed at the same position of each of the circuit layers 506a, 506b and 506c and the insulating layers 607a and 607b, or 707a and 707b, and then when the circuit layers 506a, 506b and 506c and the insulating layers 607a and 607b, or 707a and 707b are laid up, a pin is inserted into the guide holes formed through the circuit layers 506a, 506b and 506c and the insulating layers 607a and 607b, or 707a and 707b so that the via holes of the circuit layers 506a, 506b and 506c and the via holes of the insulating layers 607a and 607b, or 707a and 707b are matched.

Thereafter, as shown in FIG. 8, the laid-up circuit layers 506a, 506b and 506c and insulating layers 607a and 607b, or 707a and 707b are pressed in a direction of arrows by a press, thereby being produced into a six-layer printed circuit board, in which circuit patterns are formed at internal layers but are not formed at the uppermost and lowermost layers.

Here, the press for pressing the laid-up circuit layers 506a, 506b and 506c and insulating layers 607a and 607b, or 707a and 707b into a single six-layer printed circuit board is generally a thermal press. In this case, the laid-up circuit layers 506a, 506b and 506c and insulating layers 607a and 607b, or 707a and 707b are introduced into a case, and then the case is interposed between upper and lower heat plates in a vacuum chamber so that the laid-up circuit layers 506a, 506b and 506c and insulating layers 607a and 607b, or 707a and 707b are pressed and heated. This method is referred to as the VHL (Vacuum Hydraulic Lamination) method.

Figure 9:
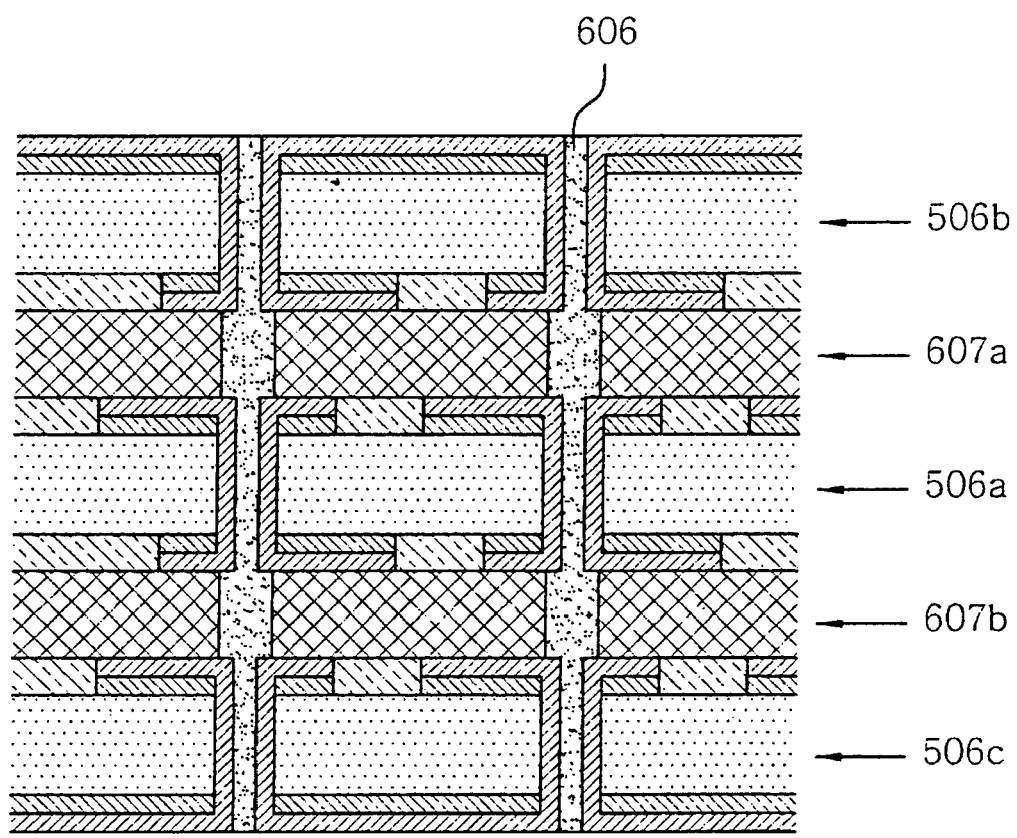
FIG. 9 is an assembled cross-sectional view of the parallel multi-layer printed circuit board manufactured by the method of the present invention.

In such a pressing step, the conductive paste 606 filling the via holes of the insulating layers 607a and 607b is changed into a fluid state due to heat, and flows into the via holes of the circuit layers 506a, 506b and 506c, as shown in FIG. 9, thereby being connected to the circuit patterns of the circuit layers 506a, 506b and 506c so that the insulating layers 607a and 607b are electrically connected to the circuit layers 506a, 506b and 506c.

Compared to the conventional method for manufacturing a parallel printed circuit board and the conventional method for manufacturing a built-up printed circuit board, the above-described connection between the circuit layers and the insulating layers in accordance with the present invention increases contact areas between the via holes of the circuit layers and the via holes of the insulating layers, thus improving electric conductivity and reliability in connection between the circuit layers and the insulating layers.

Thereafter, it is preferable to perform a buffing step for removing the conductive paste 606 flowing out from the via holes of the uppermost and lowermost circuit layers 506b and 506c, and a trimming step for trimming resin and copper films at the edge of the printed circuit board so as to prevent a product mounted on the printed circuit board from being damaged and users from being damaged from the sharp edge of the printed circuit board.

Figure 10:
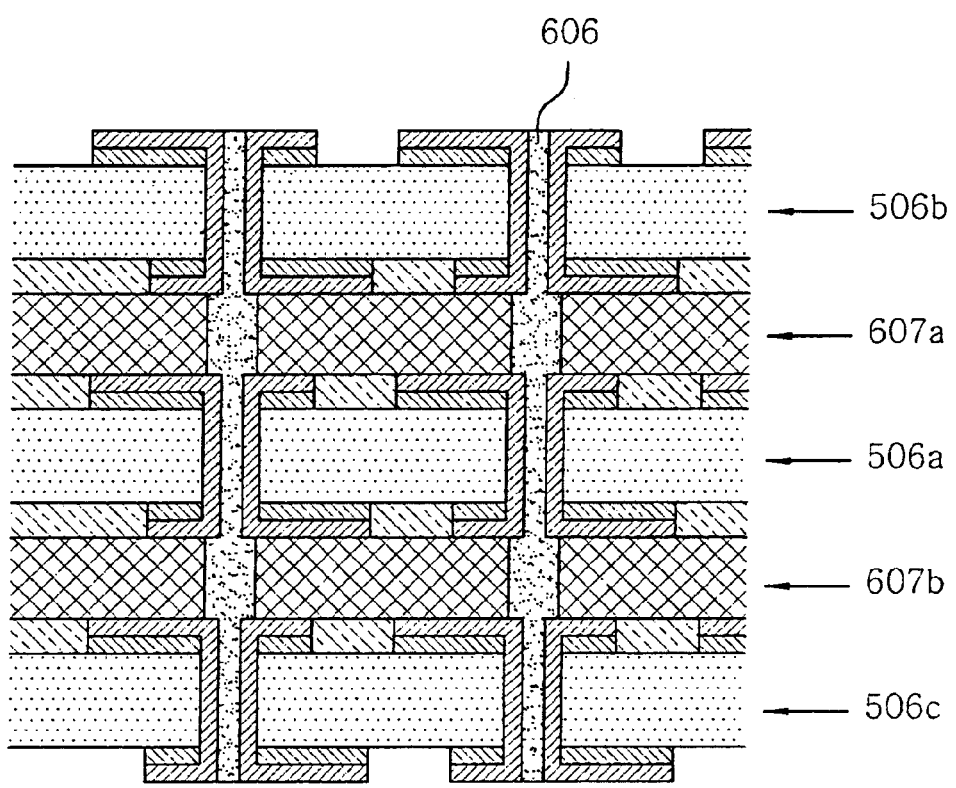
FIG. 10 is a cross-sectional view of a final product of the parallel multi-layer printed circuit board manufactured by the method of the present invention.

Thereafter, as shown in FIG. 10, circuit patterns are respectively formed on the uppermost and lowermost circuit layers 506b and 506c, thereby manufacturing a six-layer printed circuit board. Here, the circuit patterns are obtained by an etching resist depositing step, an etching resist pattern forming step and an etching step. Preferably, a dry film is used as the etching resist.

Those skilled in the art will appreciate that the above circuit patterns may be formed by various methods other than the etching method.

After the formation of the circuit patterns on the uppermost and lowermost circuit layers 506b and 506c, it is preferable to coat a solder resist on portions, of the circuit patterns formed on the uppermost and lowermost circuit layers 506b and 506c, which are not electrically connected to other layers or elements, and to surface-treat other portions, of the circuit patterns formed on the uppermost and lowermost circuit layers 506b and 506c, which are electrically connected to other layers and elements so as to prevent the exposed copper films from oxidation, improve solderability of components to be mounted on the printed circuit board, and improve conductivity.

As described above, differing from the circuit patterns of the internal circuit layers 506a, the circuit patterns of the uppermost and lowermost circuit layers 506b and 506c are formed after circuit layers 506a, 506b and 506c and insulating layers 607a and 607b are laid up. In case that the circuit patterns are formed on the uppermost and lowermost circuit layers 506b and 506c and then circuit layers 506a, 506b and 506c and insulating layers 607a and 607b are laid up, the circuit patterns on the uppermost and lowermost circuit layers 506b and 506c are damaged by the buffing step for removing the conductive paste 606 flowing out from the via holes of the uppermost and lowermost circuit layers 506b and 506c, thus causing failures.

A conventional multi-layer printed circuit board manufactured by a build-up method has a structure such that an insulating layer is stacked on a double-sided printed circuit board and a single-sided printed circuit board is stacked thereon. On the other hand, the multi-layer printed circuit board manufactured by the parallel stacking method of the present invention has a structure such that a plurality of double-sided printed circuit boards and a plurality of insulating layers are alternately stacked.

Further, a conventional multi-layer printed circuit board manufactured by a parallel or batch stacking method has a structure such that circuit layers and insulating layers are connected by a press under the condition that via holes of the circuit layers are filled by plating or with a conductive paste, thus allowing the plating layer or the conductive paste filling the via holes of the circuit layers to be distinguished from a plating layer or a conductive paste filling via holes of the insulating layers.

Based on the above-described difference between the conventional methods and the method of the present invention, it is possible to judge a manufacturing method of a printed circuit board by checking a cross-section of the printed circuit board.

As apparent from the above description, the present invention provides a multi-layer printed circuit board, in which plating and paste-plugging steps for filling via holes of circuit layers are omitted, and a method for manufacturing the multi-layer printed circuit board, thus reducing a production cost and shortening a process time.

Further, the multi-layer printed circuit board of the present invention increases contact areas between the via holes of circuit layers and via holes of insulating layers, thus improving electric conductivity and reliability in interconnection between the circuit layers and the insulating layers.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a parallel multi-layer printed circuit board, comprising the steps of:
   (A) forming a predetermined number of circuit layers, including the sub-steps of:
      (a) forming via holes through a copper stack plate;
      (b) plating surfaces of the copper stack plate and inner walls of the via holes with copper; and
      (c) forming circuit patterns on the copper stack plate;
   (B) forming a predetermined number of insulating layers, including the sub-steps of:
      (a) forming via holes through a flat-type insulating material provided with release films attached to surfaces of the flat-type insulating material;
      (b) filling the via holes with a conductive paste; and
      (c) removing the release films from the flat-type insulating material;
   (C) alternately arranging the circuit layers and the insulating layers at predetermined positions;
   (D) pressing the arranged circuit and insulating layers to fill via holes of circuit layers with a conductive paste of the insulating layers; and
   (E) forming circuit patterns on the outermost layers of a board obtained by pressing the circuit layers and the insulating layers, wherein in the sub-step (c) of the step (A), a circuit pattern is formed on one surface of the copper stack plate so as to form the circuit layer arranged on an outermost layer of the printed circuit board, and circuit patterns are formed on both surfaces of the copper stack plate so as to form the circuit layer arranged on an internal layer of the printed circuit board.

2. The method as set forth in claim 1, wherein the step (A) further includes the sub-step of:
   (d) surface-treating the copper stack plate.

3. The method as set forth in claim 1, further comprising the step of:
   (F) forming a target hole at the position of a target guide mark, serving as a reference point of drilling, on the circuit layers and the insulating layers.

4. The method as set forth in claim 1, wherein the sub-step (a) of each of the steps (A) and (B) includes the step of:
   (a) forming a guide hole at the same position, serving as a reference point of interlayer matching, on the circuit layers and the insulating layers.

5. The method as set forth in claim 1, further comprising the step of:
   (D') buffing a portion of the conductive paste, flowing out from the via holes of the outermost layers, so as to remove the protruding portion of the conductive paste, after the step (D).

6. The method as set forth in claim 1, wherein the release film has a thickness of 20 µm to 50 µm.

7. The method as set forth in claim 1, wherein the conductive paste is a metallic bond-type conductive paste impregnated with a tin (Sn) component.

8. The method as set forth in claim 1, wherein the conductive paste is a point contact-type conductive paste.

9. The method as set forth in claim 1, wherein the flat-type insulating material includes a resin material in a c-stage, and resin layers in a b-stage respectively stacked on both surfaces of the resin material.

10. A method for manufacturing a parallel multi-layer printed circuit board, comprising the steps of:
(A) forming a predetermined number of circuit layers, including the sub-steps of:
  (a) forming via holes through a copper stack plate;
  (b) plating surfaces of the copper stack plate and inner walls of the via holes with copper; and
  (c) forming circuit patterns on the copper stack plate;
(B) forming a predetermined number of insulating layers, including the sub-steps of:
  (a) forming via holes through a flat-type insulating material provided with release films attached to surfaces of the flat-type insulating material;
  (b) filling the via holes with a conductive paste; and
  (c) removing the release films from the flat-type insulating material;
(C) alternately arranging the circuit layers and the insulating layers at predetermined positions;
(D) pressing the arranged circuit and insulating layers and filling via holes in the circuit layers with conductive paste from the insulating layers; and
(E) thereafter, forming circuit patterns on the outermost layers of a board obtained by pressing the circuit layers and the insulating layers, wherein in the sub-step (c) of the step (A), a circuit pattern is formed on one surface of the copper stack plate so as to form the circuit layer arranged on an outermost layer of the printed circuit board, and circuit patterns are formed on both surfaces of the copper stack plate so as to form the circuit layer arranged on an internal layer of the printed circuit board.

11. A method for manufacturing a parallel multi-layer printed circuit board, comprising the steps of:
(A) forming a predetermined number of circuit layers, including the sub-steps of:
  (a) forming via holes through a copper stack plate;
  (b) plating surfaces of the copper stack plate and inner walls of the via holes with copper without completely filling the via holes; and
  (c) forming circuit patterns on the copper stack plate;
(B) forming a predetermined number of insulating layers, including the sub-steps of:
  (a) forming via holes through a flat-type insulating material provided with release films attached to surfaces of the flat-type insulating material;
  (b) filling the via holes with a conductive paste; and
  (c) removing the release films from the flat-type insulating material;
(C) alternately arranging the circuit layers and the insulating layers at predetermined positions;
(D) pressing the arranged circuit and insulating layers; and
(E) thereafter, forming circuit patterns on the outermost layers of a board obtained by pressing the circuit layers and the insulating layers, wherein in the sub-step (c) of the step (A), a circuit pattern is formed on one surface of the copper stack plate so as to form the circuit layer arranged on an outermost layer of the printed circuit board, and circuit patterns are formed on both surfaces of the copper stack plate so as to form the circuit layer arranged on an internal layer of the printed circuit board.

* * * * *